(12) United States Patent
Kajinami et al.

(10) Patent No.: US 12,666,917 B2
(45) Date of Patent: Jun. 23, 2026

(54) MOUNTING DEVICE AND MOUNTING METHOD

(71) Applicant: Samsung Electronics Co., Ltd., Suwon-si (KR)

(72) Inventors: Masato Kajinami, Yokohama (JP); Hansung Cho, Suwon-si (KR); Kazuya Ono, Suwon-si (KR); Byeongjin Kim, Suwon-si (KR); Daisuke Nagatomo, Yokohama (JP); Fumitaka Moroishi, Yokohama (JP); Masanori Izumita, Yokohama (JP); Sungmin Ahn, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 389 days.

(21) Appl. No.: 18/457,785

(22) Filed: Aug. 29, 2023

(65) Prior Publication Data

US 2024/0186278 A1 Jun. 6, 2024

(30) Foreign Application Priority Data

Dec. 2, 2022 (JP) ................................ 2022-193407
Apr. 6, 2023 (KR) ........................ 10-2023-0045181

(51) Int. Cl.
H10P 72/50 (2026.01)
H10P 72/00 (2026.01)
(Continued)

(52) U.S. Cl.
CPC .......... H10P 72/53 (2026.01); H10P 72/0606 (2026.01); H10W 72/071 (2026.01); H10W 80/312 (2026.01)

(58) Field of Classification Search
CPC .. H10P 72/53; H10P 72/0606; H10W 72/071; H10W 80/312
See application file for complete search history.

(56) References Cited

U.S. PATENT DOCUMENTS

2017/0025378 A1* 1/2017 Yu ............................ H01L 24/92
2019/0035762 A1* 1/2019 Ishikawa ................. H01L 24/92
(Continued)

FOREIGN PATENT DOCUMENTS

JP          2014-017471 A       1/2014
JP          2017-183628 A      10/2017
JP          2019-96867 A        6/2019

*Primary Examiner* — S M Sohel Imtiaz
(74) *Attorney, Agent, or Firm* — Harness, Dickey & Pierce, P.L.C.

(57) ABSTRACT

Provided are mounting devices and mounting methods configured to realize high-precision mounting. A mounting device including a bonding actuator having a housing, a slider accommodated in the housing in a non-contact state and provided with a head, a coil and a yoke in a non-contact state, two voice coil motors (VCMs) driven in an X-axis direction, three VCMs driven in a Y-axis direction, and one VCM driven in a Z-axis direction may be provided. The coil may be fixed to the housing and the yoke may be fixed to the slider. The bonding actuator may perform bonding while adjusting a relative position and parallelism of a chip and a wafer, by driving the slider in six axial directions, which include the X-axis direction, the Y-axis direction, the Z-axis direction, a Tx direction, a Ty direction, and a Tz direction.

20 Claims, 10 Drawing Sheets

(51) Int. Cl.
  *H10W 72/00*          (2026.01)
  *H10W 80/00*          (2026.01)

(56)          References Cited

U.S. PATENT DOCUMENTS

| 2020/0006099 | A1* | 1/2020 | Yamauchi | H01L 23/544 |
|---|---|---|---|---|
| 2020/0027855 | A1* | 1/2020 | Lee | H01L 21/563 |
| 2020/0077550 | A1* | 3/2020 | Hoefs | H01L 21/67144 |
| 2021/0313211 | A1* | 10/2021 | Yamauchi | H01L 21/681 |
| 2022/0319891 | A1* | 10/2022 | Eguchi | H01L 21/6838 |
| 2022/0359240 | A1* | 11/2022 | Takahashi | H01L 21/6838 |
| 2024/0186280 | A1* | 6/2024 | Liu | H01L 24/97 |
| 2025/0096016 | A1* | 3/2025 | Hamakawa | H01L 21/60 |

* cited by examiner

MOUNTING DEVICE AND MOUNTING METHOD

CROSS-REFERENCE TO RELATED APPLICATION(S)

This application claims benefit of priorities to Japanese Patent Application No. 2022-193407 filed on Dec. 2, 2022 in the Japanese Patent Office and Korean Patent Application No. 10-2023-0045181 filed on Apr. 6, 2023, the disclosure of each of which is incorporated herein by reference in its entirety.

BACKGROUND

The present disclosure relates to mounting devices and mounting methods.

In order to reduce power consumption and increase a driving speed, progress in a layering process of a semiconductor device is being made. A process of stacking semiconductor chips such as Chip on Chip (CoC) and Chip on Wafer (CoW), or a chip bonding process, that is, a process of mounting a semiconductor package, is being changed from a conventional connection method of realizing connection between contacts with wire bonding interposed therebetween to a connection method using a flip chip or a through silicon via (TSV) electrode.

In the conventional connection method of realizing connection between contacts with wire bonding interposed therebetween, several tens of μm of bonding precision was sufficient. However, a few μm is required for a flip chip in which a bump and a pad are in direct contact with each other, and in particular, the precision of a sub-micron is required for bonding a chip by the TSV electrode. Furthermore, in order to directly bond metals, high temperature/high pressure tends to be required during bonding. In a high-precision chip bonding device, minute changes in a structure in terms of mechanical/thermal aspects are a factor hindering precision.

Furthermore, for direct bonding without interposing bumps, bonding precision of several hundred nm or less is required. In direct bonding, local nanometer-level irregularities of a wafer may also affect bonding prevision. For this reason, it is required to align a slope between surfaces so that a distance between bonding surfaces becomes uniform.

In a conventional mounting device for high-precision chip bonding, the mounting device recognizes an alignment mark disposed on a bonding surface phase of a lower bonded object and a bonding surface phase of an upper bonded object, by a vertical two-visual field optical system inserted between the lower bonded object maintained on a bonding stage and the upper bonded object maintained on a bonding head.

The vertical two-visual field optical system is integrated with a camera for recognizing an upper side and a camera for recognizing a lower side, and has a drive shaft in at least a horizontal plane so as to laterally penetrate through a gap between the lower bonded object and the upper bonded object shortly before the bonding thereof. Based on recognition results by the vertical two-visual field optical system, the objects to be bonded are positioned and then bonded. The vertical two-visual field optical system that has been retreated for bonding is again inserted, and after the bonding, the alignment mark disposed on an upper surface of the upper bonded object is recognized. A positional deviation after mounting is calculated from the recognition results before and after the bonding, and upon bonding a next layer, the layer is mounted by aiming at a position subtracting the calculated positional deviation. By doing so, accumulation of errors caused by mounting layers may be prevented.

However, this conventional mounting device has the following tasks for the high precision of the bonding process. Because the vertical two-visual field optical system is deformed over time due to thermal/mechanical stress, when the same optical parameters are used during pre-mount and post-mount recognitions may cause an error.

To solve such a problem, in a device according to some conventional technologies, a reference mark has been prepared on a bonding stage. According to such a device, by recognizing the reference mark before recognizing mounting results, a deformation (e.g., mainly elongation by heat) of the vertical two-visual field optical system is identified and the deformation is offset when recognizing the mounting results. Accordingly, an error due to a change over time of the optical system may be suppressed.

However, in such a device, even if the error of the optical system error is suppressed, the bonding head has different heights when the chip is recognized and bonded. Thus, there may be a problem that errors may occur with respect to target coordinates calculated based on the results obtained by the alignment mark, due to such as errors with movement or vibration with movement or disturbance.

A static pressure bearing may be used for the bonding head of a bonding facility that requires higher precision. The static pressure bearing may be used to make a movable unit holding a chip remain in a non-contact state, and to realize high motion precision. Accordingly, it is possible to make high mounting precision.

However, within a bearing gap of several μm of the static pressure bearing, shaking of less than sub-microns may occur due to vibration or pressure fluctuation from the outside. Accordingly, as described above, in facilities that require more precise bonding precision of hundreds of nm or less, an error factor that cannot be ignored in terms of precision may occur.

Additionally, bonding facilities may have a means for securing surfaces of a chip to be parallel with a wafer using a static pressure spherical bearing, during a bonding process. The static pressure spherical bearing may be provided on either a lower portion of a wafer chuck serving as a wafer side or an upper portion of a bonding head serving as a chip side. The parallel securing means using the static pressure spherical bearing includes a passive type that secures the bonding head by firmly pressing the bonding head on the chuck, which holds the wafer, before adsorbing the chip, to make the surfaces of the chip to be parallel with the wafer, and an active type that detects how much the wafer and the chip are out of parallel with a sensor and adjusts the deviation sequentially using a driving source such as piezo. When more precise adjustment is required, an active type is adopted.

However, when adjusting the surfaces of the chip and the wafer to be parallel with each other, a movable unit of the static pressure spherical bearing is levitated by several μm from a fixing unit by static pressure and is landed after the adjustment, thereby causing a minute error during the landing movement.

The present disclosure has been made to solve at least one of these problems, and provides mounting devices and mounting methods configured to realize high-precision mounting.

SUMMARY

According to a some example embodiments of the present disclosure, mounting devices and mounting methods configured to implement high-precision mounting may be provided.

According to an example embodiment, a mounting device may include a head configured to support a first member, a stage configured to support a second member, at least one sensor configured to sense a deviation in positions of and parallelism between a first member and a second member, a bonding actuator configured to adjust a relative position and the relative parallelism of the first member and the second member based on the deviation of the positions and the parallelism sensed by the at least one sensor, and a controller, wherein the bonding actuator comprises a housing, a slider accommodated in the housing in a non-contact state and provided with the head, at least two X1-axis motors driven in an X-axis direction, at least three Y1-axis motors driven in a Y-axis direction, and at least one Z1-axis motor driven in a Z-axis direction, each of which has a coil and a yoke in a non-contact state, the coil being fixed to the housing and the yoke being fixed to the slider, and the controller configured to bond the first member to the second member in a state of adjusting the relative position and the relative parallelism of the first member and the second member by driving the slider in six axial directions, the six axial directions including the X-axis direction, the Y-axis direction, the Z-axis direction, a Tx direction, a Ty direction, and a Tz direction, and wherein two directions orthogonal to each other on a horizontal plane are defined as the X-axis direction and the Y-axis direction, and a direction orthogonal to the horizontal plane is defined as the Z-axis direction, and the Tx direction, the Ty direction and the Tz direction are defined as rotational directions for the X-axis direction, the Y-axis direction, and the Z-axis direction, respectively.

The mount device may further include at least one detector configured to detect an amount of movement of the slider, wherein the controller is further configured to drive the slider based on the amount of movement of the slider detected by the detector and control the relative position and the relative parallelism of the first member and the second member.

The detector may include a first pair of Y-Z-axis two-dimensional encoders configured to face each other in the X-axis direction and detect first positions in the Y-axis direction and the Z-axis direction, and a second pair of X-Z-axis two-dimensional encoders configured to face each other in the Y-axis direction and detect second positions in the X-axis direction and the Z-axis direction, and the controller may be further configured to recognize a posture of the slider using values detected by the first pair of Y-Z-axis two-dimensional encoders and the second pair of X-Z-axis two-dimensional encoders and control the posture of the slider in the six axial directions.

The detector may include each of the first pair of Y-Z-axis two-dimensional encoders comprising a Y-Z-axis two-dimensional encoder scale, each of the second pair of X-Z-axis two-dimensional encoders comprising an X-Z-axis two-dimensional encoder scale, the Y-Z-axis two-dimensional encoder scale and X-Z-axis two-dimensional encoder scale mounted on one rigid body of the slider, and a sensor head configured to read the Y-Z-axis two-dimensional encoder scale and the X-Z-axis two-dimensional encoder scale, and the controller is configured to calculate control amounts of each of the X1-axis motors, each of the Y1-axis motors, and the Z1-axis motor, respectively, with respect to a position of the first member, according to a relationship between a position in which the first member is maintained and a position of the sensor head, and collectively control each of the X1-axis motors, each of the Y1-axis motors, and the Z1-axis motor.

The slider may be supported on the housing by an air cylinder.

The slider may include a main body portion to which the yoke is fixed, and a plurality of hinges configured to connect the main body portion and the air cylinder.

The mounting device may further include a pressure sensor configured to sense pressure of each base of the air cylinder.

Each of the X1-axis motors, the Y1-axis motors, and the Z1-axis motor may be configured to move in an axial direction other than a driving direction, within a range of a gap between the coil and the yoke.

The Z1-axis motor may be configured to adjust the relative position and the relative parallelism of the first member and the second member, and apply pressure when bonding the first member to the second member.

Each of the X1-axis motors, the Y1-axis motors, and the Z1-axis motor may include a magnet fixed to the yoke.

According to an example embodiment, a mounting device may include a bonding head configured to support a first member, and a bonding stage configured to support a second member to be attached to the first member, wherein the bonding head comprises a housing, a slider provided with a head adsorbing the first member, an air cylinder levitating and supporting the slider in a non-contact state, and a plurality of voice coil motors (VCMs), and wherein each of the plurality of VCMs comprises a coil disposed at the housing and a yoke disposed at the slider.

In each of the plurality of VCMs, a cross-sectional shape of the yoke is U-shape.

The plurality of VCMs comprise two VCMs driven in a X-axis direction, three VCMs driven in a Y-axis direction, and one VCM driven in a Z-axis direction.

The plurality of VCMs drive the slider in six axial directions having a X-axis direction, a Y-axis direction, a Z-axis direction, a Tx-axis direction, a Ty-axis direction and a Tz-axis direction.

The bonding head further comprises a pressure sensor sensing pressure of the air cylinder.

The bonding head further comprise an encoder detecting an amount of movement of the slider.

The slider comprises a main body to which the yoke is attached, a cylinder rod movably mounted in a cylinder body as a slidable manner, and hinges connecting the main body and the cylinder rod.

The hinges comprises a first hinge mounted between a lower surface of the cylinder rod and a plate-shaped member, and second hinges disposed between the main body and the plate-shaped member and disposed symmetrically around a tilt axis extending in a longitudinal direction of the cylinder rod.

The plate-shaped member has a square shape, and the number of the second hinges is four.

According to an example embodiment, a mounting method may include supporting a first member by a head including, supporting a second member by a stage, detecting a deviation of positions of and a parallelism between the first member and the second member, and bonding the first member to the second member in a state of adjusting a relative position and a relative parallelism of the first member and the second member, by having a housing, a slider supported on the housing in a non-contact state and provided with the head, and a coil and a yoke provided in the non-contact state, the coil being fixed to the housing, and the yoke being fixed to the slider, and driving the slider in six axial directions based on the detected deviation of the positions and the relative parallelism, by a bonding actuator, the six axial directions including an X-axis direction, a Y-axis direction, a Z-axis direction, a Tx direction, a Ty direction, and a Tz direction, a bonding actuator including at least two X1-axis motors driven in the X-axis direction, at least three Y1-axis motors driven in the Y-axis direction, and at least one Z1-axis motor driven in the Z-axis direction, wherein two directions orthogonal to each other on a horizontal plane are defined as the X-axis direction and the Y-axis direction, and a direction orthogonal to the horizontal plane is defined as the Z-axis direction, and the Tx direction, the Ty direction and the Tz direction are defined as rotational directions for each of the X-axis direction, the Y-axis direction, and the Z-axis direction.

Advantages and effects of the present application are not limited to the foregoing content and may be more easily understood in the process of describing some example embodiments of the present disclosure.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
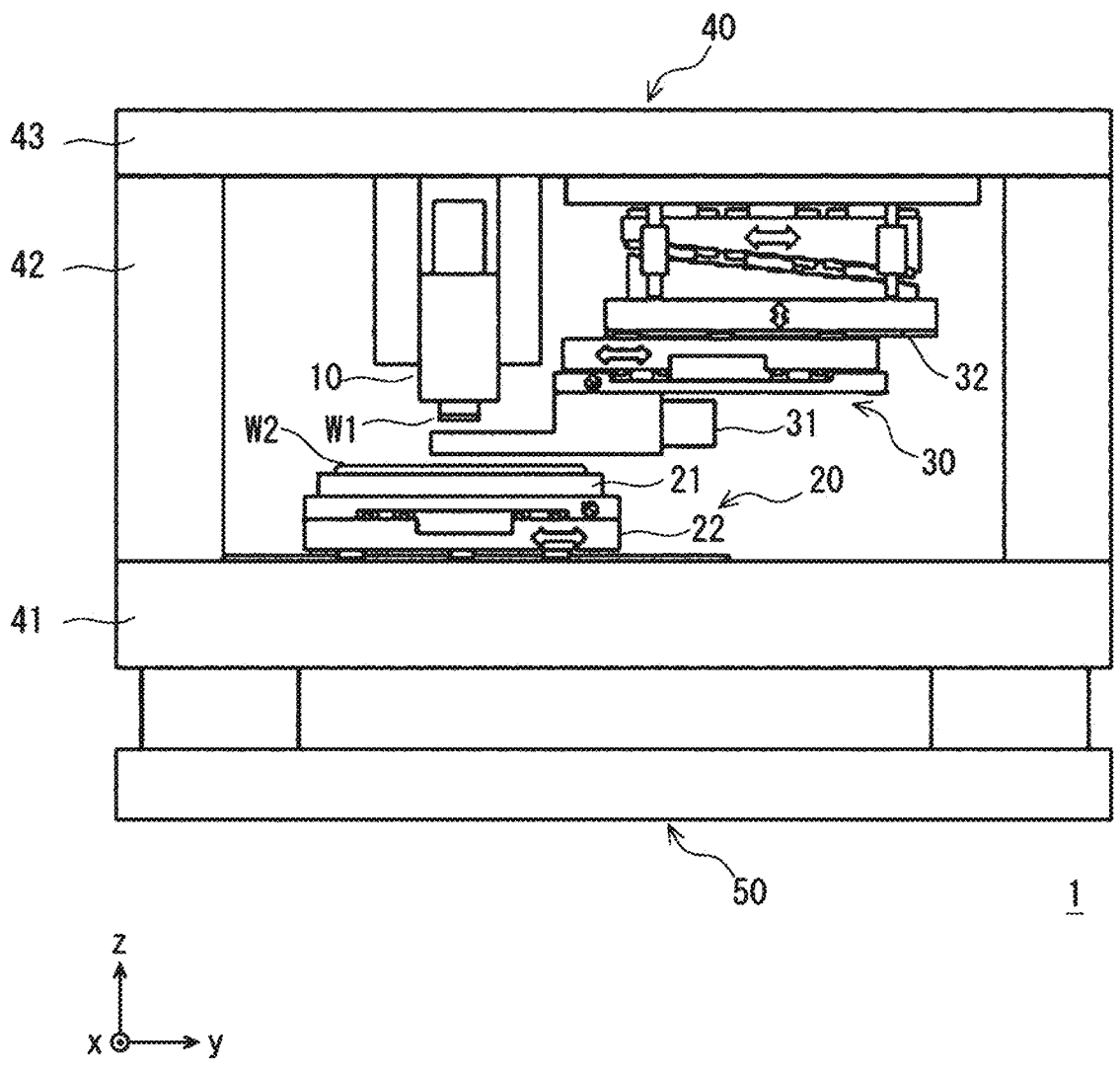
FIG. 1 is a view illustrating a schematic configuration of a mounting device according to an example embodiment of the present disclosure.

Hereinafter, some example embodiments of the present disclosure will be described with reference to the accompanying drawings as follows. For clarity of description, the following descriptions and drawings may be omitted and simplified. Furthermore, in each of the drawings, the same element may be given the same reference numeral, and duplicate descriptions may be omitted as necessary.

An example embodiment of the present disclosure may relate to a three-dimensional mounting device (e.g., a chip bonder or a die bonder) that stacks and bonds components such as semiconductor chips or interposers. Additionally, an example embodiment of the present disclosure may relate to a bonding head for aligning and bonding semiconductor chips.

As previously described, when reproducibility of a X-Y precision or parallelism of a chip and a wafer are secured using a static pressure bearing or a spherical bearing, it may be difficult to secure a X-Y precision of hundreds of nm or less for direct bonding, or parallelism. In the case of the static pressure bearing, it may be difficult to secure the X-Y precision or the parallelism due to fine vibration in an air gap. In the case of the spherical bearing, it may be difficult to secure the X-Y precision or the parallelism due to errors caused by adjustment/fixing. In the direct bonding, the parallelism between bonded surfaces may need to be secured more precisely than in the case of a bump connection. Accordingly, the following example embodiments are proposed. The following example embodiments are some examples of the present disclosure. Thus, example embodiments of the present disclosure are not limited to the following example embodiments.

FIG. 1 is a view illustrating a schematic configuration of a mounting device according to an example embodiment of the present disclosure. Referring to FIG. 1, a mounting device 1 may be a three-dimensional mounting device that aligns positions of bonded objects and mounts the bonded objects on an upper side and a lower side using a vertical two-visual field optical system. In the example embodiment illustrated in FIG. 1, a bonded object of the lower side may be a wafer W2, and a bonded object of the upper side may be a chip W1. According to some example embodiments, the bonded object may be a wafer, a die, an interposer, or the like.

As illustrated in FIG. 1, the mounting device 1 may include a bonding head 10, a bonding stage 20, and a vertical two-visual field optical system 30. Each component of the mounting device 1 may be disposed on a base frame 40. The base frame 40 may be a reference structure (alternatively, a base structure) of the mounting device 1. The base frame 40 may have a rectangular parallelepiped shape including, for example, a base 41, a side frame 42, and an upper frame 43. The side frame 42 may support the upper frame 43 on the base 41. Meanwhile, the base frame 40 may be deformed into a different shape when each component of the mounting device 1 is disposed.

An active isolator 50 may be installed below the base frame 40. The active isolator 50 is a vibration isolation device for removing vibration caused by disturbance at an installation place of the mounting device 1. As the active isolator 50, for example, a device including an accelerometer, a displacement sensor, an actuator and a damper may be used. The active isolator 50 may attenuate relatively high-frequency vibrations by a damper, detect vibration in the base frame 40, and move the base frame 40 by an actuator to offset the vibration, to reduce or remove the vibration.

Here, for convenience of description, an X-Y-Z orthogonal coordinate system is assumed. In the example embodiment illustrated in FIG. 1, a direction orthogonal to the upper surface of the base 41 may be defined as a Z-axis direction, and two directions orthogonal to each other within a horizontal plane parallel to an upper surface of the base 41 may be defined as an X-axis direction and a Y-axis direction. A+Z-axis direction is defined as an up direction, and a −Z-axis direction is defined as a down direction. On the other hand, the up direction and the down direction are for the convenience of explanation of the mounting device 1, and do not limit a direction arranged at the time of using the mounting device 1.

Hereinafter, each component of the mounting device 1 will be described.

<Bonding Head>

The bonding head 10 may function as a bonding tool supporting the chip W1 and bonding the chip W1 to the wafer W2. The bonding head 10 may include a head 13 and a bonding actuator, although not specifically illustrated in FIG. 1. The head includes, for example, adsorption equipment, and may adsorb and hold the chip W1.

The bonding actuator may move the head in parallel in the X-axis direction, the Y-axis direction, and the Z-axis direction, respectively. Additionally, the bonding actuator may rotate the head 13 in rotation directions (e.g., a Tx direction, a Ty direction, and a Tz direction) for an X-axis, a Y-axis, and a Z-axis, respectively. In other words, the bonding actuator may drive the head in six axial directions (e.g., the X-axis direction, the Y-axis direction, the Z-axis direction, the Tx direction, the Ty direction, and the Tz direction). Accordingly, the bonding head 10 may adjust a relative position and parallelism of an upper-side chip W1 and a lower-side wafer W2. Additionally, the bonding head 10 may bond the chip W1 to the wafer W2. The configuration of the bonding actuator provided in the bonding head 10 will be described in detail below.

<Bonding Stage>

The bonding stage 20 may maintain the wafer W2. The bonding stage 20 may include a wafer chuck 21 and a driving mechanism 22. The wafer chuck 21 may adsorb and support the wafer W2. The driving mechanism 22 may be fixed to the base 41. The driving mechanism 22 may move the wafer chuck 21 in parallel in the X-axis direction and the Y-axis direction. Accordingly, the bonding stage 20 may move the wafer W2 in the X-axis direction and the Y-axis direction. Meanwhile, the driving mechanism 22 may move the wafer chuck 21 in parallel in the Z-axis direction, or rotate the wafer chuck 21 in the Tx direction, the Ty direction, and the Tz direction, which are rotation directions for the X-axis direction, the Y-axis direction, and the Z-axis direction, respectively.

<Vertical Two-Visual Field Optical System>

The vertical two-visual field optical system 30 may be inserted between the chip W1 and the wafer W2 and may capture images of the chip W1 and the wafer W2 at the same time. However, the vertical two-visual field optical system 30 is not limited to be inserted between the upper-side chip W1 and the lower-side wafer W2 and to capture images of the upper-side chip W1 and the lower-side wafer W2 at the same time. For example, the vertical two-visual field optical system 30 may be inserted between a left-side chip W1 and a right-side wafer W2, and may capture images of the left-side chip W1 and the right-side wafer W2 at the same time. In other words, the vertical two-visual field optical system 30 may simultaneously capture images of the chip W1 and the wafer W2 in two directions opposite to each other, such as left and right directions, as well as up and down directions.

The vertical two-visual field optical system 30 may include an optical portion 31 and a driving mechanism 32. The driving mechanism 32 may be fixed to the base frame 40. The driving mechanism 32 may be fixed to, for example, the upper frame 42. The driving mechanism 32 may move the optical portion 31 in parallel in the X-axis direction, the Y-axis direction, and the Z-axis direction, respectively. Meanwhile, the driving mechanism 32 may rotate the optical portion 31 in the Tx direction, the Ty direction, and the Tz direction, which are rotation directions for the X-axis direction, the Y-axis direction, and the Z-axis direction, respectively.

The vertical two-visual field optical system 30 may include an image sensor generating an image by simultaneously capturing a first alignment mark formed on the chip W1 and a second alignment mark formed on the wafer W2. Additionally, the vertical two-visual field optical system 30 may include a sensor that detects the parallelism between a first bonded surface of the chip W1 and a second bonded surface of the wafer W2. The sensor may be, for example, an auto collimator using laser light as detection light. At least one of the bonding head 10 and the bonding stage 20 may adjust a relative position and parallelism of the chip W1 and the wafer W2 based on the image acquired by the image sensor and the parallelism detected by the sensor, and then bond the chip W1 to the wafer W2.

On the other hand, as long as it is possible to capture images of the alignment marks of the chip W1 and the wafer W2 and to detect the parallelism between the bonded surfaces thereof, an optical system other than the vertical two-visual field optical system 30 may be adopted.

Here, an operation of the mounting device 1 will be described. First of all, the chip W1 may be transferred to the bonding head 10 by, for example, a robot, and may be vacuum-clamped by a lower head. Additionally, the wafer W2 may be transferred to the wafer chuck 21 by, for example, the robot, and may be vacuum-clamped. Additionally, the driving mechanism 22 may move the bonding stage 20 so that a target portion of the wafer W2 to be bonded to the chip W1 may be moved to a lower portion of the bonding head 10.

After clamping the chip W1 and wafer W2, the vertical two-visual field optical system 30 may calculate a target position of bonding based on the alignment marks or pads of the chip W1 and wafer W2. Additionally, the vertical two-visual field optical system 30 may detect relative slopes (e.g., parallelism between the bonded surfaces) of the chip W1 and the wafer W2 and calculate an inclination angle when the bonding head 10 performs the bonding. That is, the vertical two-visual field optical system 30 may calculate values in the X-axis direction, the Y-axis direction, the Z-axis direction, the Tx direction, the Ty direction, and the Tz direction of the bonding head 10 during bonding.

The bonding head 10 may control a posture thereof and bond the chip W1 to the wafer W2, based on the values in the X-axis direction, the Y-axis direction, the Z-axis direction, the Tx direction, the Ty direction, and the Tz direction calculated by the vertical two-visual field optical system 30. Additionally, the bonding head 10 may control a bonding load according to the chip W1.

<Bonding Actuator>

Figure 2:
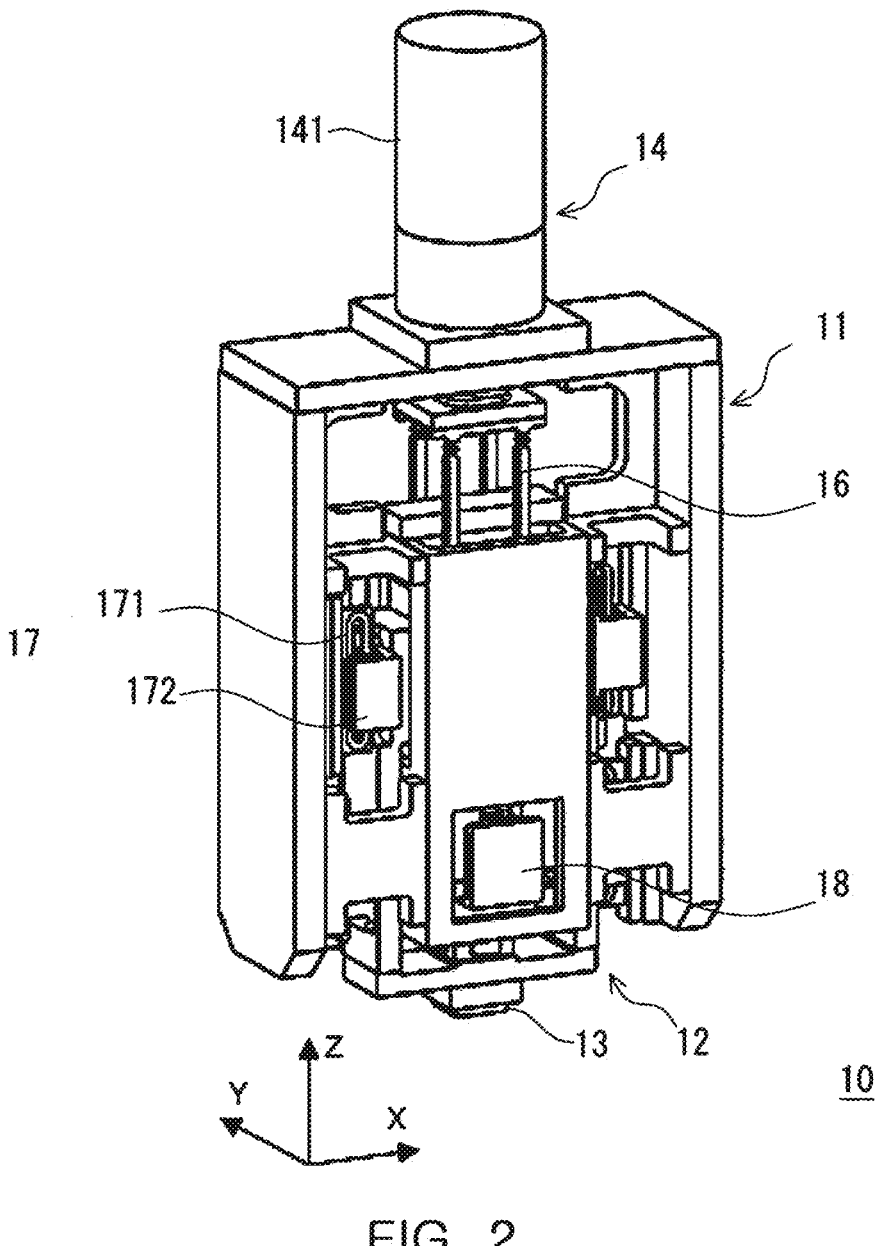
FIG. 2 is a view schematically illustrating a bonding head included in the mounting device illustrated in FIG. 1 according to an example embodiment.
Figure 3:
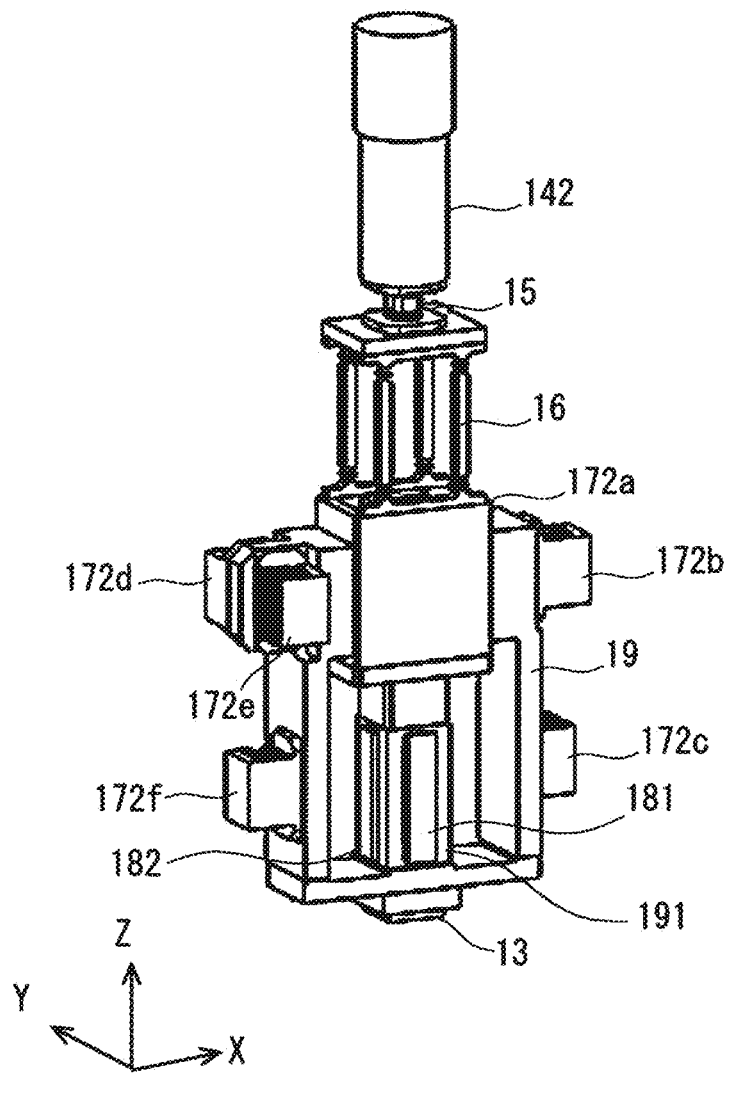
FIG. 3 is a view illustrating a configuration of a slider illustrated in FIG. 2 according to an example embodiment.
Figure 4:
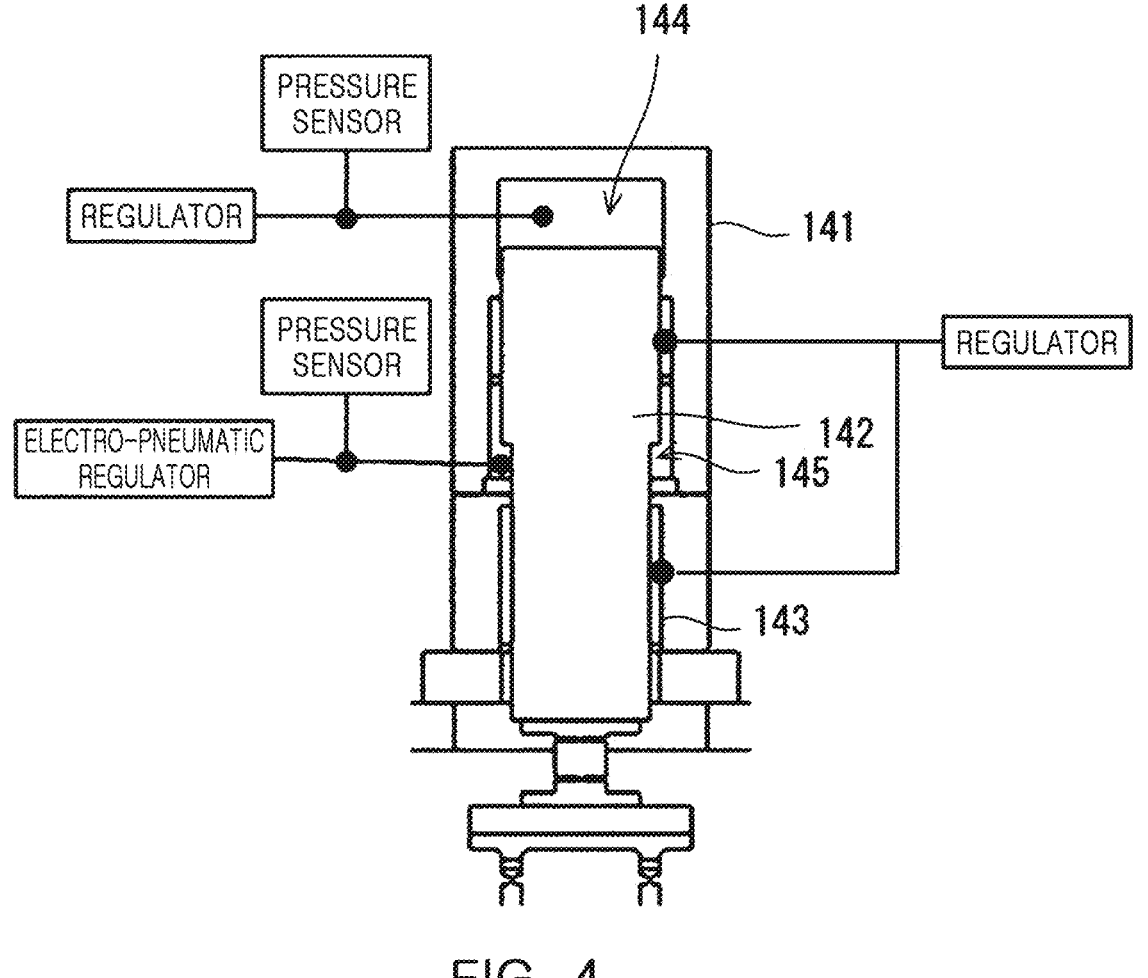
FIG. 4 is a view illustrating a configuration of an air cylinder illustrated in FIG. 2 according to an example embodiment.

A bonding actuator provided in the bonding head 10 for performing the bonding will be described in detail with reference to the drawings. FIG. 2 is a view illustrating a schematic configuration of the bonding head 10 according to an example embodiment of the present disclosure. FIG. 3 is a diagram illustrating a slider 12 of FIG. 2. FIG. 4 is a view illustrating the air cylinder 14 of FIG. 2.

As illustrated in FIG. 2, the bonding head 10 may include a housing 11 as a fixing unit and a slider 12 as an operating unit, as a main configuration. The housing 11 may be a box-shaped member in which at least a bottom surface thereof (e.g., a surface in the –Z-axis direction) is released (e.g., opened). In an example embodiment illustrated in FIG. 2, the housing 11 has side surfaces in the +Y-axis directions released, in addition to the bottom surface thereof. That is, the housing 11 may be a frame body having two side surfaces in +X-axis directions and an upper side surface (a surface in the +Z-axis direction) connecting the two side surfaces.

The slider 12 may be accommodated in the housing 11. A tip end of the slider 12 is provided with a head 13 having an adsorption mechanism of the chip W1. The head 13 may protrude from a bottom surface of the housing 11.

The slider 12 may be levitated and supported in a non-contact state by interposing the air cylinder 14 as a static pressure bearing. As illustrated in FIG. 4, the air cylinder 14 may be an air bearing cylinder including a cylinder body 141, a cylinder rod 142, and an air bearing 143.

The cylinder body 141 has a cylindrical shape and may be provided on an upper surface (e.g., a surface in the +Z axis direction) of the housing 11. Within the cylinder body 141, the cylinder rod 142 provided on an upper surface of the slider 12 may be movably mounted in a slidable manner. The air bearing 143 may be provided inside the cylinder body 141 to surround the cylinder rod 142. By supplying air to the air bearing 143 by a regulator, the air may be interposed between the cylinder body 141 and the cylinder rod 142. Accordingly, a deviation in thrust due to resistance of an elastic body such as an O ring used for an inner seal that occurs in a contact-type air cylinder may be excluded.

As illustrated in FIG. 4, the air cylinder 14 may include an upper base 144 and a lower base 145.

For example, the regulator that manually adjusts a flow rate of air may be connected to the upper base 144. The upper base 144 may be controlled to a constant pressure by the regulator. Meanwhile, for example, an electro-pneumatic regulator may be connected to the lower base 145. The electro-pneumatic regulator may adjust pressure of the lower base 145 by adjusting the flow rate of air.

By adjusting the pressure of the lower base 145 by the air bearing 143 in a state in which the air is interposed between the cylinder body 141 and the cylinder rod 142, the cylinder rod 142 may move in the Z-axis direction (i.e., up and down direction) without coming into contact with the cylinder body 141.

The air cylinder 14 may generate a force corresponding to a self-weight of a slider 12 provided in a lower portion to cancel the self-weight of the slider 12. Additionally, the air cylinder 14 may apply the pressure (e.g., a bonding load) desired for bonding the chip W1 and the wafer W2, to the chip W1. On the other hand, the bonding load may be applied by a voice coil motor (VCM) in the Z-axis direction described below, and may be applied by both sides of the air cylinder 14 and the VCM.

Additionally, the bonding head 10 may include a pressure sensor for sensing pressure of each base of the air cylinder 14. Accordingly, the pressure of each base of the air cylinder 14 may be monitored. Meanwhile, the air cylinder 14 may be a double-acting type or a single-acting type, as described above. Additionally, the air cylinder 14 may have a degree of freedom not only in the Z-axis direction but also in the Tz direction.

As described above, in an example embodiment of the present disclosure, a force may be driven in a non-contact type using the air bearing, and thus may mitigate or prevent a force generated by friction as in a contact-type air cylinder. However, because there is no contact point thereon, a posture of the bonding head 10 may collapse when a load is applied, and a position of a mounted chip W1 may be shifted, or parallel states of the chip W1 and the wafer W2 may be changed. For this reason, it is desired to perform posture control so that there is no change in a posture even during control of a bonding load.

Accordingly, when applying the bonding load, the pressure of the lower base 145 performing self-weight cancellation with the electro-pneumatic regulator may be lowered so that a weight of the slider 12 may act as a bonding load and may be applied. Accordingly, rather than controlling a load by increasing the pressure of the upper base 144, a burden on hinges 15 and 16 may be reduced, and maintenance performance of the posture of the bonding head 10 may be easily secured.

Additionally, when the weight of the slider 12 is less than a desired bonding load, the bonding load may be adjusted by lowering the pressure of the lower base 145 performing the self-weight cancellation with the electro-pneumatic regulator as well as increasing the pressure of the upper base 144.

Referring to FIGS. 2 and 3, the bonding head 10 includes a plurality of VCMs 17. Here, an example in which six VCMs 17a to 17f are provided may be illustrated. Meanwhile, in FIG. 2, some of the six VCMs 17a to 17f may be hidden by other members. The VCMs 17a to 17f may include coils 171a to 171f serving as a driving unit in a non-contact state, respectively, and yokes 172a to 172f serving as a movable unit, respectively. Marks of the VCMs 17a to 17f and the coils 171a to 171f correspond to positions in which the yokes 172a to 172f are provided, respectively, and descriptions thereof may be omitted in the drawings. Not all of the six VCMs 17a to 17f has been specifically depicted in the drawings, because an illustration of one VCM is also applicable to the other VCMs.

As illustrated in FIG. 3, the yokes 172a to 172f may be provided at the slider 12. On the other hand, the coils 171a to 171f may be provided in positions corresponding each of the yoke 172a to 172f fixed to the slider 12, respectively, at the housing 11. In other words, a coil 171 as a driving unit may be fixed to the housing 11 as a fixing unit, and a yoke 172 as a movable unit may be fixed to the slider 12 as the operating unit. When a plurality of VCMs 17a to 17f, a plurality of coils 171a to 171f, and a plurality of yokes 172a to 172f are individually marked, they may be combinedly marked as a VCM 17, a coil 171, and a yoke 172.

The VCM 17 is a one-axis motor configured to perform a direct motion in one direction. Among the VCMs 17a to 17f, two VCMs 17c and 17e are X1-axis motors driven in the X-axis direction, three VCMs 17b, 17d and 17f are Y1-axis motors driven in the Y-axis direction, and one VCM 17a is a Z1-axis motor driven in the Z-axis direction. On the other hand, the one-axis motor is not limited to a linear motor using electromagnetic force of the VCM as a driving source, and a linear actuation mechanism with a different configuration may be adopted as the one-axis motor. Additionally, the bonding head 10 may include at least two X1-axis motors, at least three Y1-axis motors, and at least one Z1-axis motor, but the present disclosure is not necessarily limited to such a configuration.

Figure 5:
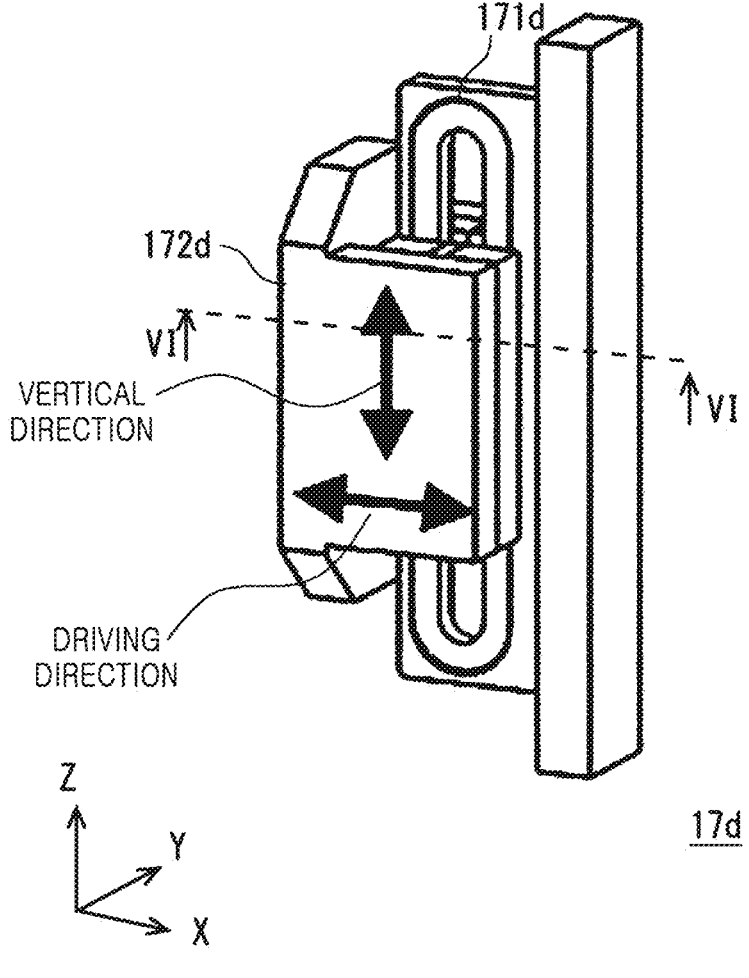
FIG. 5 is a view illustrating a configuration of a voice coil motor (VCM) illustrated in FIG. 2 according to an example embodiment.

FIG. 5 is a view illustrating the configurations of a VCM. Referring to FIG. 5, the configuration of the VCM 17d is illustrated as a representative of two VCMs 17c and 17e driven in the X-axis direction and three VCMs 17b, 17d and 17f driven in the Y-axis direction. Additionally, FIG. 6 is a view representing a cross-section in the VI-VI direction of FIG. 5.

Figure 6:
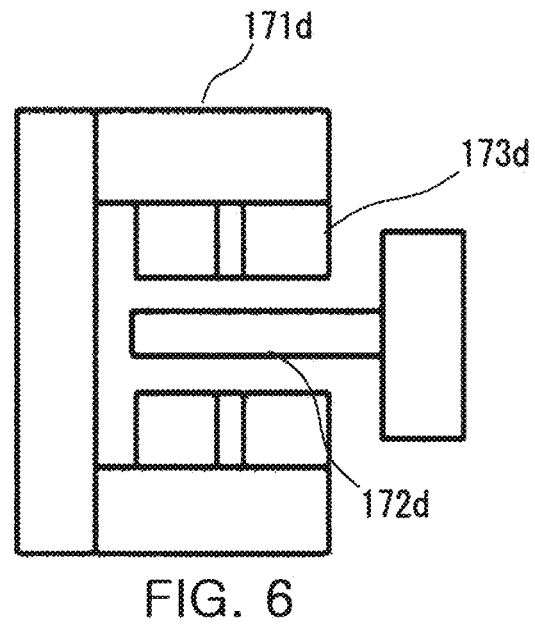
FIG. 6 is a view illustrating a cross section in a VI-VI direction of FIG. 5.

As illustrated in FIGS. 5 and 6, the yoke 172d may be a member with a U-shaped cross-sectional member. The yoke 172d may generally include a metal having a high magnetic permeability. A magnet 173d may be fixed to two opposite surfaces of yoke 172d by magnetic adsorption, respectively. The coil 171d may be formed of a conductive wire, and may generate a magnetic field depending on a current direction by an electrical connection. The coil 171d may be electrically connected to a magnetic circuit formed by the magnet 173d, thereby driving the yoke 172d in a desired (or alternatively, predetermined) driving direction.

Additionally, the coil 171d may extend in the Z-axis direction. Accordingly, even if the slider 12 moves in the Z-axis direction by the VCM 17a driven in the Z-axis direction, driving force in the X-axis direction or the Y-axis direction may be maintained. A moving direction of the other VCMs 17b to 17f by the VCM 17a driven in the Z-axis direction may be defined as a longitudinal direction. On the other hand, each of the VCMs 17 may also move passively in an axial direction other than a control direction within a range of a gap between the coil 171 and the yoke 172 in a non-contact state.

In this way, a so-called "moving magnet method" in which a magnet 173 is disposed at the yoke 172 as the movable unit may be adopted. In this case, there is no need to supply power to the yoke 172, and there is no need to provide a wiring. However, when non-contact electric power supply is performed, the coil may be disposed at the operating unit to suppress a weight of the operating unit of the bonding actuator, and the yoke and the magnet may be disposed at the fixing unit.

On the other hand, as described above, the VCM 17a driven in the Z-axis direction may have a thrust that can apply pressure to the chip W1 when pressurization is desired for bonding the chip W1 to the wafer W2 as well as adjusting the position of the slider 12.

Additionally, referring to FIGS. 2 and 3, an encoder 18 may be provided in a central portion of a main body 19 constituting the slider 12. The encoder 18 may be a detector configured to detect the amount of movement of slider 12. Meanwhile, at least one encoder 18 may be provided, but a plurality of encoders may be provided according to some example embodiments. Here, the encoder 18 may be a linear encoder including a two-dimensional (2D) encoder scale (2D encoder scale) provided in slider 12. The 2D encoder scale may be read by a sensor head provided at the housing 11.

Figure 7:
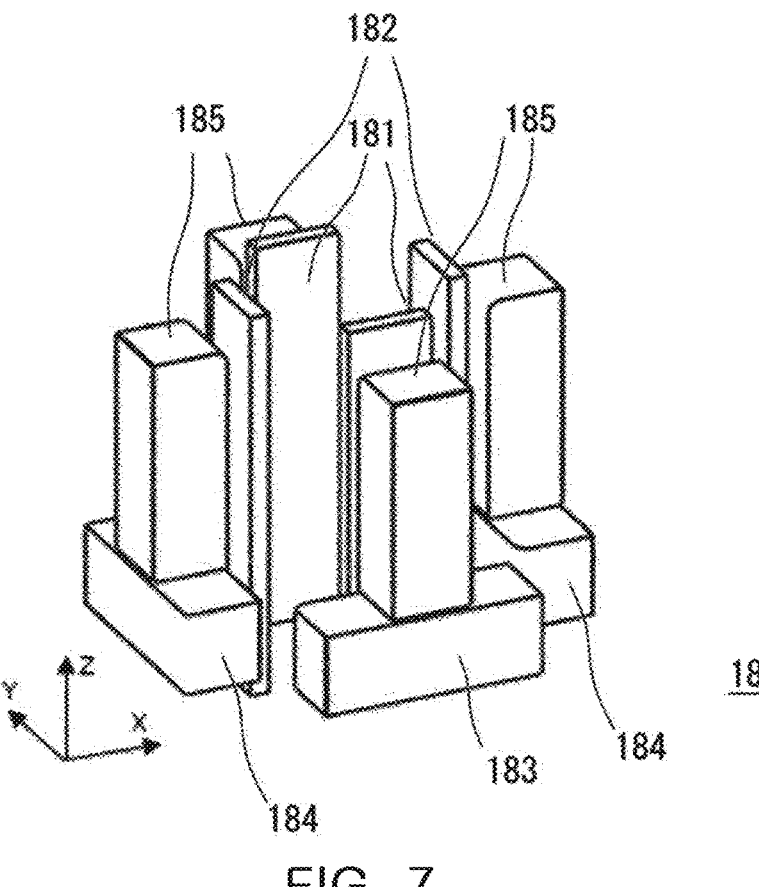
FIG. 7 is a view illustrating a portion of a configuration of an encoder illustrated in FIG. 2 according to an example embodiment.

FIG. 7 is a view illustrating a portion of a configuration of an encoder illustrated in FIG. 2, according to an example embodiment. In FIG. 7, a layout of the 2D encoder scale and the sensor head constituting the encoder 18 may be illustrated. The 2D encoder scale and the sensor head may provide one position detection sensor.

As illustrated in FIG. 7, the encoder 18 may include a pair of X-Z-axis 2D encoder scales 181, a pair of Y-Z-axis 2D encoder scales 182, an X-axis sensor head 183, a Y-axis sensor head 184, and a Z axis sensor head 185. The pair of X-Z-axis 2D encoder scales 181 and the pair of Y-Z-axis 2D encoder scales 182 may all be mounted on one rigid body. In the example embodiment illustrated in FIG. 3, each of the 2D encoder scales may be provided on four sides of a square pillar-shaped member 191, extending along a longitudinal direction (e.g., the Z-axis direction) of the cylinder rod 142.

The X-Z-axis 2D encoder scales 181 may be disposed to face each other in the Y-axis direction and may be used to detect positions thereof in the X-axis direction and the Z axis direction. The X-Z-axis 2D encoder scales 181 may be disposed along a width direction of the X-axis and installed to extend in the Z-axis direction. Two sensor heads, that is, an X-axis sensor head 183 and a Z-axis sensor head 185, may be provided for one X-Z-axis 2D encoder scale 181.

The Y-Z-axis 2D encoder scales 182 may be disposed to face each other in the X-axis direction and may be used to detect positions thereof in the Y-axis direction and the Z-axis direction. The Y-Z-axis 2D encoder scale 182 may be disposed along a width direction of the Y-axis and installed to extend in the Z axis direction. Two sensor heads, that is, a Y-axis sensor head 184 and the Z-axis sensor head 185, may be provide for one Y-Z-axis 2D encoder scale 182.

The sensor head may be, for example, an optical sensor having a light emitting unit and a light receiving unit disposed to insert (or sandwich) the encoder scales 181 and 182 therebetween, respectively. Additionally, the X-Z-axis 2D encoder scale 181 and the Y-Z-axis 2D encoder scale 182 may have, for example, a light transmission portion and a light blocking portion repeatedly formed at regular intervals in the X-axis direction and the Y-axis direction. A driving amount (e.g., a relative movement amount of the slider 12) may be detected from the count number of signals on a pulse obtained by the sensor head.

The amount of movement in the X-axis direction, the Y-axis direction, and the Tz direction may be detected from detection values of the X-axis sensor head 183 and the Y-axis sensor head 184. The amount of movement in the Z-axis direction, the Ty direction, and the Tx direction may be detected from a detection value of the Z-axis sensor head 185.

Meanwhile, in an example embodiment, the encoder 18 that detects a relative displacement amount of the slider 12, may be a detector detecting the amount of the movement of the slider 12, and may also be used to detect an absolute position of the slider 12. A controller described below may recognize a posture of the slider 12 of the bonding actuator and control a posture of the slider 12 in the six axial directions using the detection values detected by the encoder 18. The controller may be included in the bonding actuator.

The slider 12 may include hinges 15 and 16 and a main body 19 in addition to the cylinder rod 142, the yoke 172, and the encoder scales 181 and 182 as described above. The main body 19 is a member having a frame-like shape. The yokes 172b and 172c may be disposed on an external side surface of the main body 19 on the +X-axis, and the yokes 172d. 172e and 172f may be disposed on an external side of the main body 19 on the −X-axis. Additionally, the yoke 172a may be disposed on an upper side surface of the main body 19.

Figure 8:
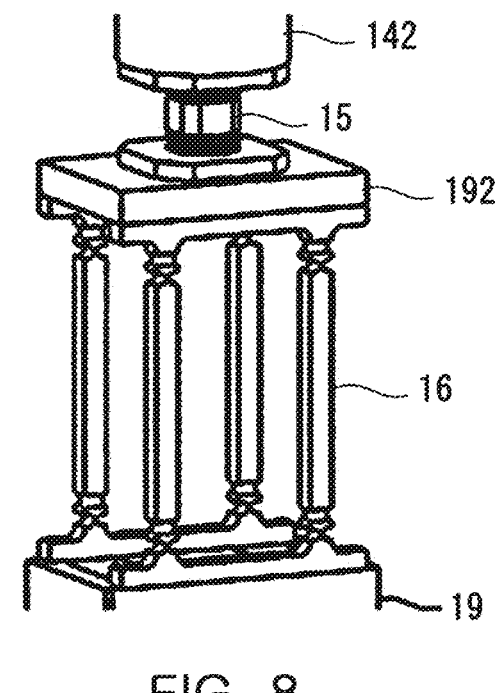
FIG. 8 is an enlarged view illustrating a hinge portion illustrated in FIG. 2 according to an example embodiment.

Additionally, the hinges 15 and 16 may be provided between the cylinder rod 142 and the main body 19. FIG. 8 is an enlarged view illustrating a portion provided with the hinges 15 and 16 illustrated in FIG. 2 according to an example embodiment. Additionally, FIG. 9 is a view illustrating operations of the hinges 15 and 16.

As illustrated in FIG. 8, the hinge 15 may be mounted on a lower surface of the cylinder rod 142. The hinge 15 may include a tilt axis extending along the longitudinal direction (e.g., the Z-axis direction) of the cylinder rod 142, and may rotate around the tilt axis. The tilt axis is represented by a dotted line passing through the cylinder rod 142 in FIG. 9.

A square-shaped plate-shaped member 192 centered on the tilt axis may be provided in a lower portion of the hinge 15. Four hinges 16 may be provided between the plate-shaped member 192 and an upper surface of the main body 19. The hinges 16 may be symmetrically disposed around the tilt axis. The hinges 16 may perform parallel movement of the main body 19 with respect to the cylinder rod 142.

Figure 9:
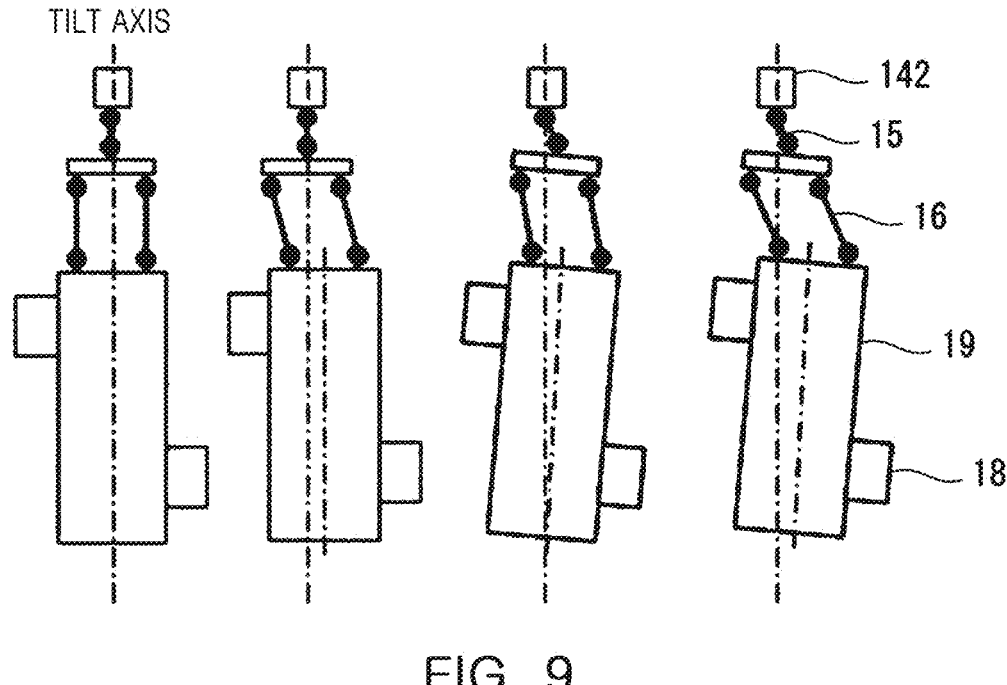
FIG. 9 is a view illustrating an operation of a hinge.

As illustrated in FIG. 9, the hinges 15 and 16 may be elastically deformed corresponding to the amount of movement in five axial directions (e.g., the X-axis direction, the Y-axis direction, the Tx direction, the Ty direction, and the Tz direction) except the Z-axis direction of the main body 19 in a downward direction. The hinges 15 and 16 may be connection portions that supplement a difference between a degree of freedom of the air cylinder 14 and a degree of freedom of the main body 19.

In the case in which the slider 12 moves by a small movement amount, when a rolling tool using a ball or a needle having a sufficiently large circumferential length in a rolling direction is used for the movement amount, it may be difficult to supply a lubricant to a contact portion of the rolling tool, and thus a Fretting phenomenon may be easily caused. Additionally, when a sliding tool is used as the connection portion, a change in a static friction or a moving friction may occur between two opposite surfaces, and accordingly, the sliding tool may not be a proper tool if very high precision such as an adjustment of a relative position or parallelism of the chip W1 and the wafer W2 is desired. For this reason, a hinge tool configured to perform elastic deformation as described above may be adopted as the connection portion.

Additionally, the hinges 15 and 16 may have strength that does not buckle against a load caused by acceleration or a self-weight when applying the bonding load to the air cylinder 14 or when moving in the Z-axis direction. On the other hand, an air tube may be used to apply negative pressure desired for adsorption of the chip W1 by the head 13, and, in controlling the slider 12, a layout that can ignore a tension (e.g., tensile stress) may be made. Additionally, a vacuum port may be provided in the air cylinder 14, and vacuum paths may be provided in components of the cylinder rod 142 and the hinge 15 and 16, thereby applying negative pressure for adsorption of the chip W1 to the head 13 by excluding disturbance.

In the bonding head 10 including the aforementioned configuration, as illustrated in FIG. 3, a central portion (e.g., a center) of the cylindrical cylinder rod 142, a tilt axis of the hinge 15, a central portion (e.g., a center) of a rectangle in which arrangement positions of four hinges 16 are considered as vertexes when viewing the four hinges 16 from the Z-axis direction, a central portion (e.g., a center) of a square column-shaped member in which the X-Z-axis 2D encoder scale 181 and the Y-Z-axis 2D encoder scale 182 are disposed, and a central portion (e.g., a center) of the head 13 may be disposed on the same straight line parallel to the Z-axis.

Figure 10:
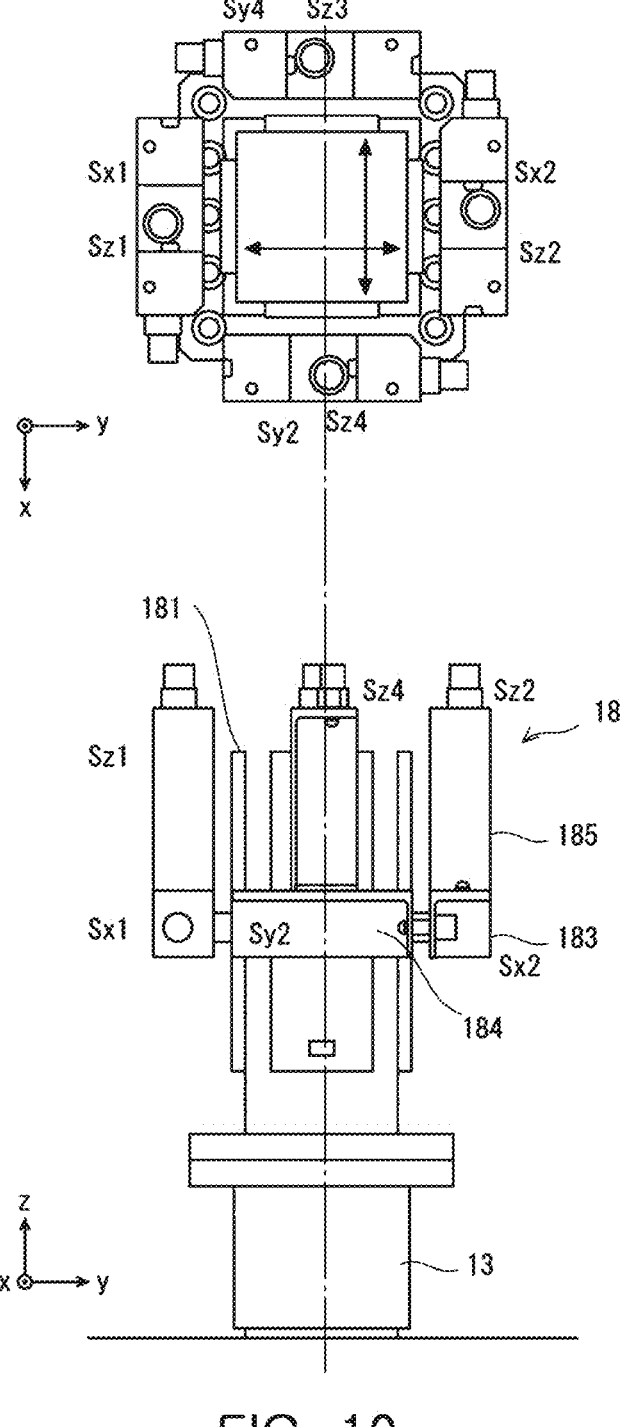
FIG. 10 is a view illustrating a detection value of an encoder illustrated in FIG. 2 according to an example embodiment.
Figure 11:
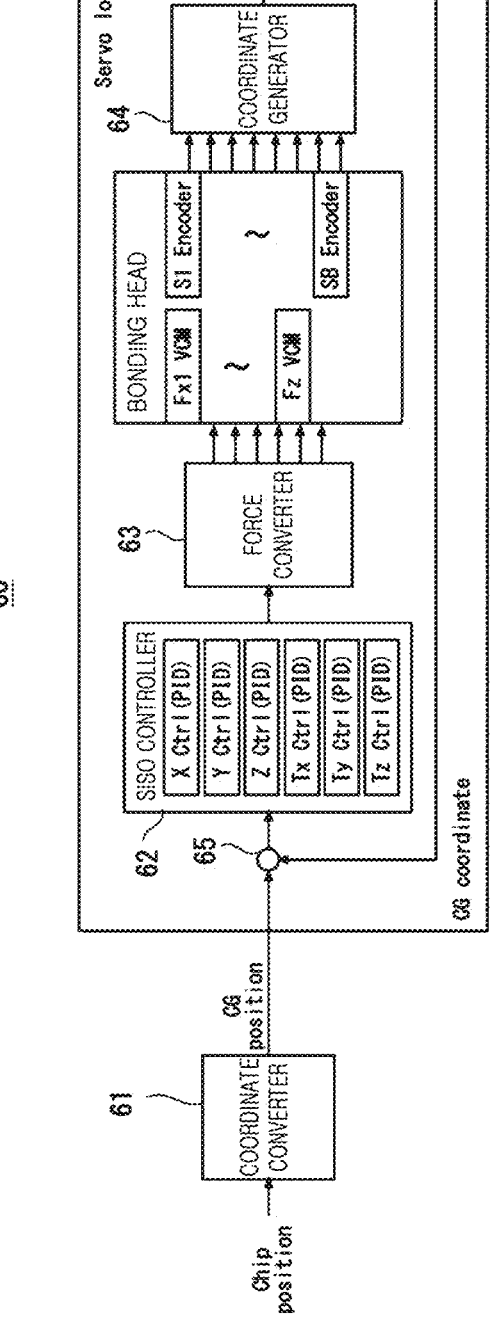
FIG. 11 is a block diagram schematically illustrating a control according to an example embodiment of the present disclosure.
Figure 12:
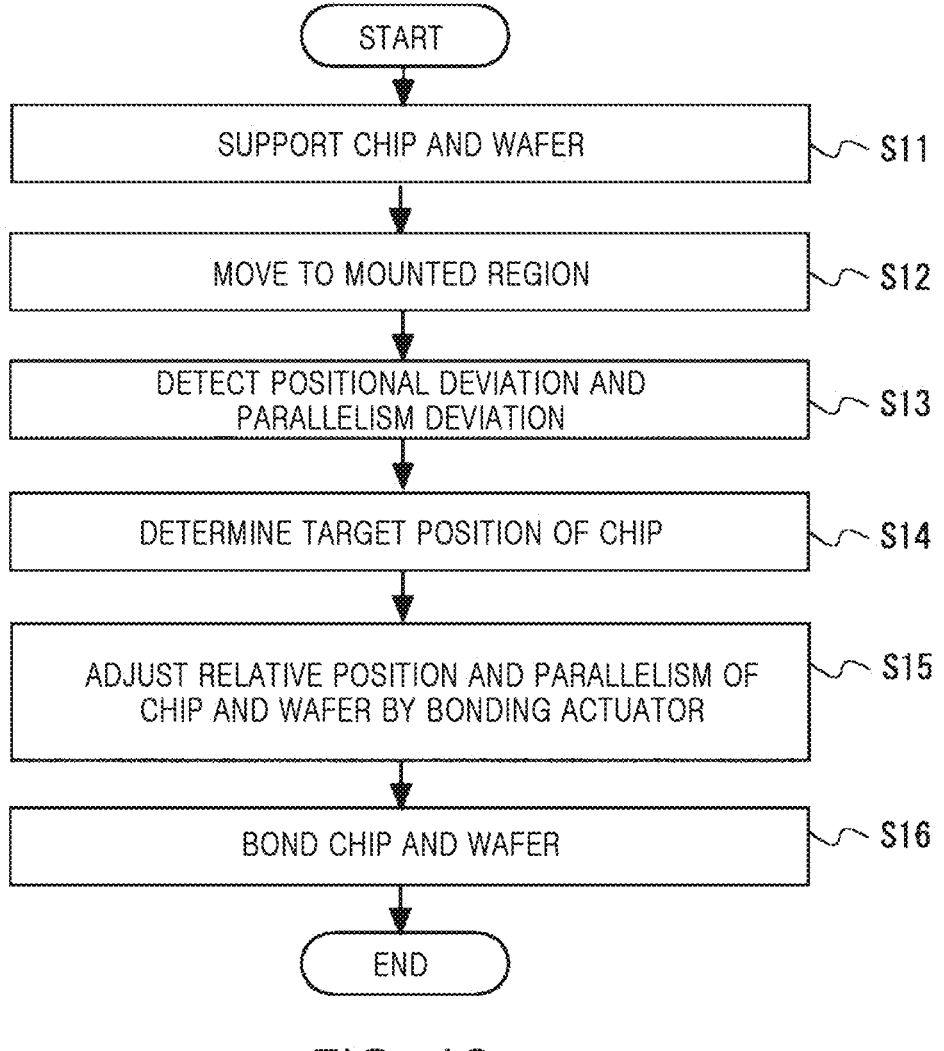
FIG. 12 is a flowchart illustrating a mounting method according to an example embodiment of the present disclosure.

Here, referring to FIGS. 10, 11, and 12, a mounting method by the bonding head 10 will be described. FIG. 10 is a view provided to illustrate a detection value of the encoder of FIG. 2. At an upper end of FIG. 10, a view when an encoder portion of FIG. 2 is viewed from above may be illustrated, and at a lower end thereof, a view when the encoder portion is viewed in the X-axis direction may be illustrated. FIG. 11 is a block diagram schematically illustrating a controller according to an example embodiment of the present disclosure. FIG. 12 is a flowchart illustrating a mounting method according to an example embodiment of the present disclosure.

As described above, the encoder 18 may include eight position detection sensors, including four position detection sensors for detecting the X-axis direction, the Y-axis direction, and the Tz direction, and four position detection sensors for detecting the Z-axis direction, the Tx direction, and the Ty direction.

As illustrated in FIG. 10, on each side of the square pillar-shaped member 191 of the slider 12 to be controlled, the X-Z-axis 2D encoder scale 181 and the Y-Z-axis 2D encoder scale 182 may be mounted. The square pillar-shaped member 191 may be formed of a material having a low thermal expansion rate (e.g., a rigid body that is not easily affected by heat). The X-axis sensor head 183, the Y-axis sensor head 184, and the Z-axis sensor head 185 may also be formed of materials with the same low thermal expansion rate. For this reason, a positional relationship between the X-Z-axis 2D encoder scale 181 and the Y-Z-axis 2D encoder scale 182, the X-axis sensor head 183, the Y-axis sensor head 184, and the Z axis sensor head 185 may be difficult to change.

Meanwhile, it is assumed that the positional relationship between each position detection sensor is already known or measured in advance. Additionally, it is assumed that a position of the center of gravity of a control target and relative distances of each scale are already known. Meanwhile, the control object may refer to an entire slider 12 provided with a yoke, an encoder scale, and the like.

The two X-axis sensor heads 183 facing each other in the Y-axis direction may output detection values of Sx1 and Sx2. Additionally, the two Y-axis sensor heads 184 facing each other in the X-axis direction may output detection values of Sy1 and Sy2. Additionally, the detection values of Sz1 and Sz2 may be output by the two X-axis sensor heads 183, and the detection values of Sz3 and Sz4 may be output by the two Y-axis sensor heads 184, respectively.

As illustrated in FIG. 11, the controller 60 performing posture control in the six axial directions of the control target may include a coordinate converter 61, a single input single output (SISO) controller 62, a force converter 63, a coordinate generator 64, and a calculation unit 65. Hereinafter, referring to FIGS. 11 and 12, a mounting method according to an example embodiment will be described, and a configuration of the controller 60 will be described.

As illustrated in FIG. 12, first, the chip W1 may be supported by the bonding head 10, and the wafer W2 may be supported on the bonding stage 20 (S11), and the bonding stage 20 may be moved such that the chip W1 is located on a mounted region of the wafer W2 (S12). A positional deviation and a parallelism deviation of the chip W1 and the wafer W2 may be detected using the vertical two-visual field optical system (S13), and a target position (e.g., a chip position) of the chip W1 may be determined (S14).

After that, the relative position and parallelism of the chip W1 and the wafer W2 may be adjusted by the bonding actuator described above (S15). For example, the coordinate converter 61 illustrated in FIG. 11 may convert a coordinate of the target position of the chip W1 into a coordinate of a target center of gravity (CG position) of the control target. The SISO controller 62 may perform proportional integral derivative (PID) control and generate control signals (e.g., XCtrl, YCtrl, ZCtrl, TxCtrl, TyCtrl, and TzCtrl) for moving the center of gravity of the control target to the target center of gravity.

The force converter 63 may generate a command signal for a driver such as a VCM 17 based on the control signal. For example, the force converter 63 may convert a control signal for controlling a position of the center of gravity of the control target into a command signal representing a position of the VCM 17. The command signal may be transmitted to each of the VCMs 17 of the bonding head 10.

When the VCM 17 is driven based on the command signal and the control target moves, the detection value may be output by each of position detection sensors of the encoder 18. The detection values may be supplied to the coordinate generator 64. The coordinate generator 64 may calculate a coordinate of a current center of gravity position (CG coordinate) of the control target based on the detection values (e.g., the position of the encoder). The calculation unit 65 may calculates a difference between the current center of gravity position and the target center of gravity position, and may control a servo loop generating the command signal for the driver such as the VCM 17 by applying the difference.

Meanwhile, the position of the control target in the Z-axis direction may be variable with respect to the sensor head. When the center of gravity of the control target for the sensor head is changed, the amount of shaking at the target position of the chip W1 also may change Thus, a position deviation of the chip W1 from the position in the Z-axis direction may be estimated and a control signal calculating. Instead of controlling a plurality of VCMs 17, respectively, within the servo loop, the command signals of six VCMs 17 may be sequentially calculated within one servo loop.

That is, based on a relationship between the X-axis 2D encoder scale 181, the X-axis sensor head 183 and the Z-axis sensor head 185, and a relationship between the Y-axis 2D encoder scale 182, the Y-axis sensor head 184 and the Z-axis sensor head 185, the controller 60 may generate a command for the driver of each of the VCMs 17 from the target position of the chip W1.

When control of six degrees of freedom is performed only with the values of each sensor head, it may be difficult to determine an exact position because a target position of a final chip W1 is offset. On the other hand, according to the method of an example embodiment of the present disclosure described above, oscillations caused by interference in the positions of each of the VCMs 17 may be easily suppressed with a filter, thereby improving control performance and performing more precise control.

Referring back to FIG. 12, the bonding head 10 may bond the chip W1 and the wafer W2 (S16). For example, at least one of the air cylinder 14 and the VCM 17*a* for driving the slider 12 in the Z-axis direction may apply the pressure for bonding the chip W1 and the wafer W2 in order to bond the chip W1 and the wafer W2. As described above, a semiconductor device including the chip W1 and the wafer W2 may be manufactured.

As described above, the bonding head 10 may be provided with the static pressure bearing, the hinge tool, the plurality of non-contact driving sources, and the plurality of position detection sensors may be disposed to determine a position of six degrees of freedom with high precision. Accordingly, the relative position and parallelism of the chip W1 and the wafer W2 may be adjusted with high precision.

For example, when an X-Y-Z-axis stage is used as the bonding stage 20, control of multiple axes may be performed by dividing the multiple axes and mechanically connecting each of the multiple axes so that a Y-axis stage may be mounted on an X-axis stage, and a Z-axis stage may be mounted on the Y-axis stage again. However, the technologies may be complicated in configuration, and when mechanical deformation is performed, a final motion precision of the operating unit may be deteriorated. In order to solve the problem, a laser interferometer may be used to monitor the operating unit at all times, but then it may be difficult to make the configuration of the device compact.

On the other hand, in some example embodiments of the present disclosure, a position detection sensor (e.g., the encoder 18 and the motor (i.e., the VCM 17)) may be mounted on the operating unit (e.g., the slider 12). Additionally, the moving portion may be driven in a non-contact state, and thus may not cause disturbance due to friction. For this reason, the control of the operating unit may be improved, and a high-precision mounting may be implemented. Additionally, bonding heads 10 according to some example embodiment may have a compact structure and may have an increased rigidity.

According to some example embodiments, any functional blocks shown in the figures and described above (e.g., the control unit 160) may perform various functions including functions not discussed herein and may be implemented as processing circuitry such as hardware including logic circuits, a hardware/software combination executing software, or a combination thereof. For example, the processing circuitry may include, but is not limited to, a central processing unit (CPU), an arithmetic logic unit (ALU), a digital signal processor, a microcomputer, a field programmable gate array (FPGA), programmable logic unit, a microprocessor, application-specific integrated circuit (ASIC), etc. The control unit 160 may operate based on instructions stored in a memory or may operate based on preprogrammed functions. The processing circuitry may include electrical components such as at least one of transistors, resistors, capacitors, etc. The processing circuitry may include electrical components such as logic gates including at least one of AND gates, OR gates, NAND gates, NOT gates, etc.

The present disclosure is not limited to the above-described example embodiments and may be appropriately changed without departing from the spirit. In other words, the present disclosure is not limited to the above-described example embodiments and the accompanying drawings, and is intended to be limited by the appended claims. Therefore, those of ordinary skill in the art may make various replacements, modifications, or changes without departing from the scope of the present disclosure defined by the appended claims, and these replacements, modifications, or changes should be construed as being included in the scope of the present disclosure.

What is claimed is:

1. A mounting device comprising:

a head configured to support a first member;

a stage configured to support a second member;

a sensor configured to sense a deviation in positions of and parallelism between a first member and a second member;

a bonding actuator configured to adjust a relative position and a relative parallelism of the first member and the second member based on the deviation of the positions and the parallelism sensed by the sensor; and a controller, wherein the bonding actuator comprises, a housing, a slider accommodated in the housing in a non-contact state and provided with the head thereon, and at least two X1-axis motors driven in an X-axis direction, at least three Y1-axis motors driven in a Y-axis direction, and at least one Z1-axis motor driven in a Z-axis direction, each of which has a coil and a yoke in a non-contact state, the coil being fixed to the housing and the yoke being fixed to the slider, wherein the controller configured to bond the first member to the second member in a state of adjusting the relative position and the relative parallelism of the first member and the second member by driving the slider in six axial directions, the six axial directions including the X-axis direction, the Y-axis direction, the Z-axis direction, a Tx direction, a Ty direction, and a Tz direction, and wherein two directions orthogonal to each other on a horizontal plane are defined as the X-axis direction and the Y-axis direction, and a direction orthogonal to the horizontal plane is defined as the Z-axis direction, and the Tx direction, the Ty direction and the Tz direction are defined as rotational directions for the X-axis direction, the Y-axis direction, and the Z-axis direction, respectively.

2. The mounting device of claim 1, further comprising:
at least one detector configured to detect an amount of movement of the slider,
wherein the controller is further configured to drive the slider based on the amount of movement of the slider detected by the at least one detector and control the relative position and the relative parallelism of the first member and the second member.

3. The mounting device of claim 2, wherein
the at least one detector comprises a first pair of Y-Z-axis two-dimensional encoders configured to face each other in the X-axis direction and detect first positions in the Y-axis direction and the Z-axis direction, and a second pair of X-Z-axis two-dimensional encoders configured to face each other in the Y-axis direction and detect second positions in the X-axis direction and the Z-axis direction, and
the controller is further configured to recognize a posture of the slider using values detected by the first pair of Y-Z-axis two-dimensional encoders and the second pair of X-Z-axis two-dimensional encoders and control the posture of the slider in the six axial directions.

4. The mounting device of claim 3, wherein
the at least one detector comprises,
each of the first pair of the Y-Z-axis two-dimensional encoders comprising a Y-Z-axis two-dimensional encoder scale,
each of the second pair of the X-Z-axis two-dimensional encoders comprising an X-Z-axis two-dimensional encoder scale, the Y-Z-axis two-dimensional encoder scale and the X-Z-axis two-dimensional encoder scale mounted on one rigid body of the slider, and
a sensor head configured to read the Y-Z-axis two-dimensional encoder scale and the X-Z-axis two-dimensional encoder scale, and
the controller is configured to
calculate control amounts of each of X1-axis motors, each of Y1-axis motors, and a Z1-axis motor, respectively, with respect to a position of the first member, according to a relationship between a position in which the first member is maintained and a position of the sensor head, and
collectively control each of the X1-axis motors, each of the Y1-axis motors, and the Z1-axis motor.

5. The mounting device of claim 1, wherein the slider is supported on the housing by an air cylinder.

6. The mounting device of claim 5, wherein the slider includes a main body portion to which the yoke is fixed and a plurality of hinges configured to connect the main body portion and the air cylinder.

7. The mounting device of claim 5, further comprising:
a pressure sensor configured to sense pressure of each base of the air cylinder.

8. The mounting device of claim 1, wherein each of the X1-axis motors, the Y1-axis motors, and the Z1-axis motor is configured to move in an axial direction other than a driving direction, within a range of a gap between the coil and the yoke.

9. The mounting device of claim 1, wherein the Z1-axis motor is configured to adjust the relative position and the relative parallelism of the first member and the second member, and apply pressure when bonding the first member to the second member.

10. The mounting device of claim 4, wherein
each of the X1-axis motors, the Y1-axis motors, and the Z1-axis motor comprises a magnet fixed to the yoke.

11. A mounting device comprising:
a bonding head configured to support a first member; and
a bonding stage configured to support a second member to be attached to the first member;
wherein the bonding head comprises a housing, a slider provided with a head adsorbing the first member, an air cylinder levitating and supporting the slider in a non-contact state, and a plurality of VCMs (voice coil motors), and
wherein each of the plurality of VCMs comprises a coil disposed at the housing and a yoke disposed at the slider.

12. The mounting device of claim 11, wherein
in each of the plurality of VCMs, a cross-sectional shape of the yoke is U-shape.

13. The mounting device of claim 11, wherein
the plurality of VCMs comprise two VCMs driven in a X-axis direction, three VCMs driven in a Y-axis direction, and one VCM driven in a Z-axis direction.

14. The mounting device of claim 11, wherein
the plurality of VCMs drive the slider in six axial directions having a X-axis direction, a Y-axis direction, a Z-axis direction, a Tx-axis direction, a Ty-axis direction and a Tz-axis direction.

15. The mounting device of claim 11, wherein
the bonding head further comprises a pressure sensor sensing pressure of the air cylinder.

16. The mounting device of claim 11, wherein
the bonding head further comprise an encoder detecting an amount of movement of the slider.

17. The mounting device of claim 11, wherein
the slider comprises a main body to which the yoke is attached, a cylinder rod movably mounted in a cylinder body as a slidable manner, and hinges connecting the main body and the cylinder rod.

18. The mounting device of claim 17, wherein
the hinges comprises a first hinge mounted between a lower surface of the cylinder rod and a plate-shaped member, and second hinges disposed between the main body and the plate-shaped member and disposed symmetrically around a tilt axis extending in a longitudinal direction of the cylinder rod.

19. The mounting device of claim 18, wherein
the plate-shaped member has a square shape, and a number of the second hinges is four.

20. A mounting method comprising:
supporting a first member by a head;
supporting a second member by a stage;
detecting a deviation of positions of and a parallelism between the first member and the second member; and
bonding the first member to the second member in a state of adjusting a relative position and a relative parallelism of the first member and the second member, by having a housing, a slider supported on the housing in a non-contact state and provided with the head, and a coil and a yoke provided in the non-contact state, the coil being fixed to the housing, and the yoke being fixed to the slider, and driving the slider in six axial directions based on the deviation of the positions and the relative parallelism, by a bonding actuator, the six axial directions including an X-axis direction, a Y-axis direction, a Z-axis direction, a Tx direction, a Ty direction, and a Tz direction, the bonding actuator including at least two X1-axis motors driven in the X-axis direction, at least three Y1-axis motors driven in the Y-axis direction, and at least one Z1-axis motor driven in the Z-axis direction, wherein two directions orthogonal to each other on a horizontal plane are defined as the X-axis direction and the Y-axis direction, and a direction orthogonal to the horizontal plane is defined as the Z-axis direction, and the Tx direction, the Ty direction and the Tz direction are defined as rotational directions for each of the X-axis direction, the Y-axis direction, and the Z-axis direction.

* * * * *